(12) United States Patent
Hao et al.

(10) Patent No.: US 9,417,745 B2
(45) Date of Patent: Aug. 16, 2016

(54) TOUCH SCREEN, THE MANUFACTURING METHOD OF THE TOUCH SCREEN AND DISPLAY DEVICE

(71) Applicant: BOE TECHNOLOGY GROUP CO., LTD., Beijing (CN)

(72) Inventors: Guangye Hao, Beijing (CN); Yunsik Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 35 days.

(21) Appl. No.: 14/361,515

(22) PCT Filed: Dec. 18, 2013

(86) PCT No.: PCT/CN2013/089761
§ 371 (c)(1),
(2) Date: May 29, 2014

(87) PCT Pub. No.: WO2015/027639
PCT Pub. Date: Mar. 5, 2015

(65) Prior Publication Data
US 2015/0103266 A1    Apr. 16, 2015

(30) Foreign Application Priority Data

Aug. 30, 2013    (CN) .......................... 2013 1 0390550

(51) Int. Cl.
*G06F 3/044* (2006.01)
*H03K 17/96* (2006.01)

(52) U.S. Cl.
CPC ............. *G06F 3/044* (2013.01); *H03K 17/9622* (2013.01); *G06F 2203/04103* (2013.01); *H03K 2217/96075* (2013.01); *H03K 2217/960765* (2013.01)

(58) Field of Classification Search
CPC .............. H03K 17/96; H03K 17/9622; H03K 2217/96075; H03K 2217/960765; G06F 3/041; G06F 3/044; G06F 3/045; G06F 2203/04103; H01J 9/00; H01L 27/12; G02F 1/136; G09G 3/28
See application file for complete search history.

(56) References Cited

U.S. PATENT DOCUMENTS

2010/0066650 A1    3/2010    Lee et al.
2011/0069033 A1    3/2011    Meng et al.
(Continued)

FOREIGN PATENT DOCUMENTS

CN    101699377 A    4/2010
CN    101751181 A    6/2010
(Continued)

OTHER PUBLICATIONS

Chinese Office Action regarding Application No. 2012105448867 dated Sep. 26, 2014. Translation provided by Dragon Intellectual Property Law Firm.
(Continued)

*Primary Examiner* — Lun-Yi Lao
*Assistant Examiner* — Johny Lau
(74) *Attorney, Agent, or Firm* — Harness, Dickey & Pierce, P.L.C.

(57) ABSTRACT

The embodiment of the present invention discloses a touch screen, its manufacturing method and a display device. The method comprise the following steps: first, forming patterns of shielding layer on a substrate; then forming patterns of bridging layer and peripheral traces on the shielding layer by a single patterning process; thereafter, forming patterns of insulating layer on the peripheral traces; and finally, forming patterns of touch control electrode layer. In the present invention, the patterning of the bridging layer and peripheral traces can be achieved by a single patterning process using a mask plate, which reduces the number of patterning processes in the manufacturing process and improves the manufacturing efficiency of the touch screen thereby reducing the cost of production.

19 Claims, 5 Drawing Sheets

(56) References Cited

U.S. PATENT DOCUMENTS

| | | | |
|---|---|---|---|
| 2011/0205168 A1* | 8/2011 | Jun | G06F 3/044 345/173 |
| 2013/0057793 A1* | 3/2013 | Uchida | G02F 1/136213 349/42 |
| 2015/0009422 A1 | 1/2015 | Tung | |
| 2015/0027870 A1* | 1/2015 | Yang | G06F 3/041 200/5 R |

FOREIGN PATENT DOCUMENTS

| | | | |
|---|---|---|---|
| CN | 101751190 A | | 6/2010 |
| CN | 102023770 A | | 4/2011 |
| CN | 102446047 A | | 5/2012 |
| CN | 102681712 A | | 9/2012 |
| CN | 102693028 A | | 9/2012 |
| CN | 102799311 A | * 11/2012 | G06F 3/041 |
| CN | 202533920 U | | 11/2012 |
| CN | 103019496 A | | 4/2013 |
| CN | 203480463 U | | 3/2014 |
| EP | 250080 A2 | | 9/2012 |

OTHER PUBLICATIONS

International Search Report and Written Opinion mailed Jun. 23, 2014 regarding PCT/CN2013/089761. Translation provided by Dragon Intellectual Property Law Firm.
First Office Action regarding Chinese application No. 201310390544.9, dated Oct. 22, 2015. Translation provided by Dragon Intellectual Property Law Firm.
International Search Report and Written Opinion mailed Jun. 12, 2014 regarding PCT/CN2013/089755. Translation provided by Dragon Intellectual Property Law Firm.
First Office Action regarding Chinese application No. 20130390465.8, dated Oct. 8, 2015. Translation provided by Dragon Intellectual Property Law Firm.
Second Office Action regarding Chinese application No. 201310390465.8, dated Apr. 1, 2016. Translation provided by Dragon Intellectual Property Law Firm.
International Search Report and Written Opinion mailed Jun. 9, 2014 regarding PCT/CN2013/089694. Translation provided by Dragon Intellectual Property Law Firm.
First Office Action regarding Chinese application No. 201310390550.4, dated Oct. 14, 2014. Translation provided by Dragon Intellectual Property Law Firm.

* cited by examiner

TOUCH SCREEN, THE MANUFACTURING METHOD OF THE TOUCH SCREEN AND DISPLAY DEVICE

CROSS-REFERENCE TO RELATED APPLICATIONS

This application is the U.S. national phase of PCT Application No. PCT/CN2013/089761, filed on Dec. 18, 2013 which claims priority to Chinese patent application No. 201310390550.4 filed on Aug. 30, 2013, the disclosures of which are incorporated in their entirety by reference herein.

TECHNICAL FIELD

The embodiment of the present invention relates to the field of touch control technique, and more particularly to a touch screen, and its manufacturing method and a display device.

BACKGROUND

With rapid development of display technology, touch screen (Touch Screen Panel) has gradually become widespread in people's life. Currently, the touch screen can be divided into the following classes according to its working principle: resistive, capacitive, infrared and surface acoustic wave, electromagnetic, oscillatory wave inductive and frustrated total internal reflection type inductive and etc. Among them, the capacitive touch screen by its unique touch control principle is become more and more popular in the art due to its high sensitivity, long life, high transmittance, etc.

Figure 1A:
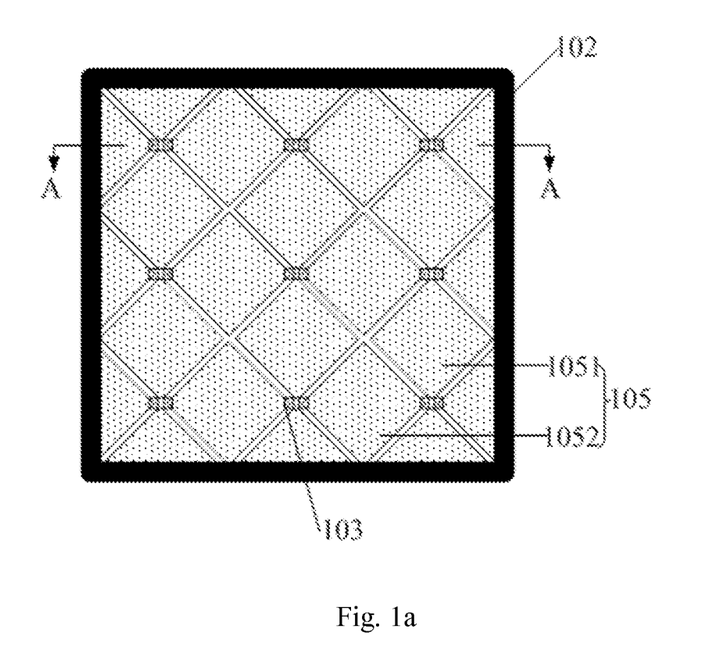
FIG. 1a is a schematic plan view of the OGS touch control module in the prior art.
Figure 1B:
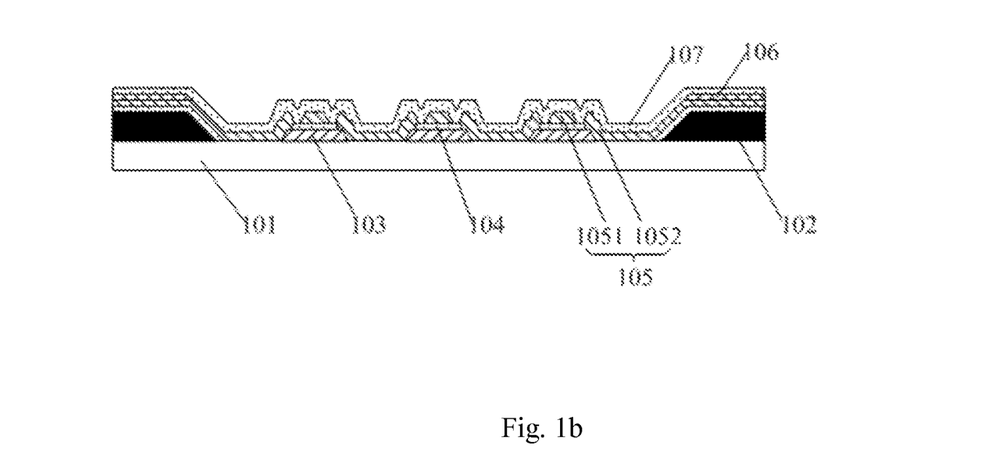

Currently, monolithic (OGS, One Glass Solution) touch control module is more widely used, which has a sensor and a touch control conductive film formed in a single layer directly on a substrate, as shown in FIG. 1a and FIG. 1b. The specific configuration of the OGS touch control module comprises the following layers in sequence laminated on the substrate 101: shielding layer (Blackmatrix, abbreviated BM) 102, bridging layer (Bridge) 103, insulating layer (Overcoat, abbreviated OC) 104, touch control electrode layer 105, peripheral traces 106 and passivation layer 107; wherein the touch control electrode layer 105 specifically comprises touch control sensing electrodes 1051 and touch control driving electrodes 1052 interleaved and insulated to each other; the touch control sensing electrodes 1051 and the touch control driving electrodes 1052 are of diamond pattern; adjacent but disconnected touch control driving electrodes 1052 can be bridged by bridging layer 103; the touch control sensing electrodes 1051 and the touch control driving electrodes 1052 are connected with corresponding peripheral traces 106 in non-display area of the touch control module; the peripheral traces 106 transmit signals on the touch control electrode layer 105 to corresponding IC chip and the signals will be analyzed and processed.

The OGS touch control module with the above configuration need to be patterned using six mask plates (Mask) in preparation: the first Mask is used to form patterns of the shielding layer 102; the second Mask is used to form patterns of the bridging layer 103; the third Mask is used to form patterns of the insulating layer 104; the fourth Mask is used to form patterns of the touch control electrode layer 105; the fifth Mask is used to form patterns of the peripheral traces 106; and the sixth Mask is used to form patterns of the passivation layer 107. The number of the mask plates used in the above mentioned preparing process is relative larger and each mask plate should be precisely aligned with the substrate in usage, which can reduce production efficiency and increase production cost.

SUMMARY

Embodiments of the present invention provide a touch screen, the manufacturing method of the touch screen and a display device, which can solve the problems that the number of the mask plates is relatively larger and the production cost is relatively low in the manufacturing process of OGS touch control module in prior art.

One embodiment of the present invention is to provide a manufacturing method of a touch screen, which comprises:
Forming patterns of bridging layer and peripheral traces on a substrate by a single patterning process;
Forming patterns of insulating layer on the peripheral traces;
Forming patterns of touch control electrode layer on the insulating layer, wherein the touch control electrode layer comprises touch control sensing electrodes and touch control driving electrodes interleaved and insulated to each other; and the bridging layer bridges adjacent touch control driving electrodes or adjacent touch control sensing electrodes.

Another embodiment of the present invention provides a touch screen which comprises a substrate; bridging layer, peripheral traces, insulating layer and touch control electrode layer stacked on the substrate sequentially; wherein:
The bridging layer, the insulating layer and the touch control electrode layer are located in touch control area of the touch screen; the touch control electrode layer comprises touch control sensing electrodes and touch control driving electrodes interleaved and insulated to each other and provided on the same layer; the bridging layer bridges adjacent touch control driving electrodes or adjacent touch control sensing electrodes;
The bridging layer, the peripheral traces, the insulating layer and the touch control electrode layer are also located in a non-touch control area.

Another embodiment of the present invention provides a display device which comprises the above mentioned touch screen provided by the embodiment of the present invention.

The beneficial effects of the embodiment of the present invention comprise:
The embodiments of the present invention provide a touch screen, the manufacturing method of the touch screen and a display device. The method comprise the following steps: forming patterns of bridging layer and peripheral traces on a substrate by a single patterning process; thereafter, forming patterns of insulating layer on the peripheral traces; and finally, forming patterns of touch control electrode layer on the insulating layer. In the present invention, the patterning of the bridging layer and peripheral traces can be achieved simultaneously by a single patterning process, which reduces the number of patterning processes in the manufacturing process and improves the manufacturing efficiency of the touch screen, thereby reducing the cost of production.

BRIEF DESCRIPTION OF THE DRAWINGS

FIG. 1b is a schematic cross sectional view through A-A in FIG. 1a.

DETAILED DESCRIPTION

The following will describes specific implementations of the touch screen, the manufacturing method of the touch screen and the display device provided by the embodiments of the present invention in detail in conjunction with drawings.

The thicknesses, shapes and area sizes of various thin films in the drawings are not drawn to scale to reflect the real size ratio. They are only used to schematically illustrate the content of the present invention.

Figure 2:
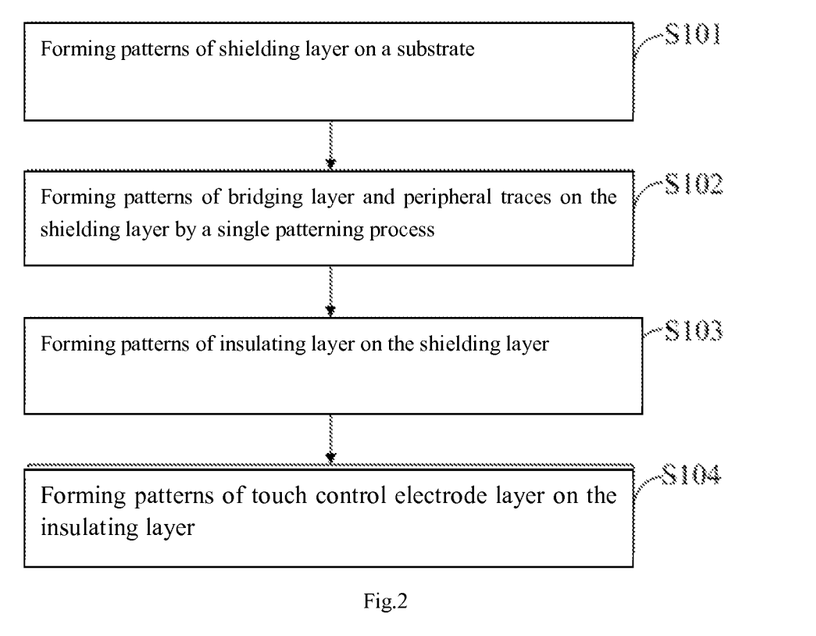
FIG. 2 is a flowchart of manufacturing method of the touch screen provided by the embodiment of the present invention.
Figure 3A:
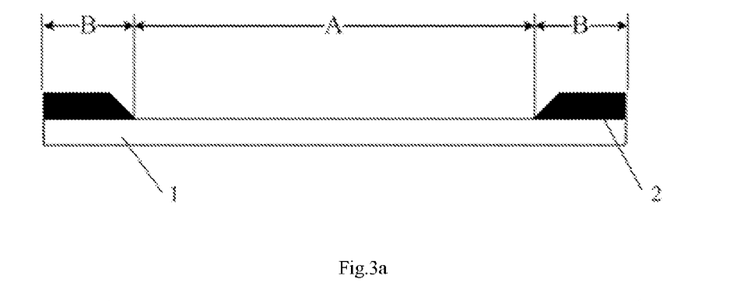
FIG. 3a is a schematic cross-sectional view showing the structure after shielding layer is formed on the substrate according to the embodiment of the present invention.
Figure 3B:
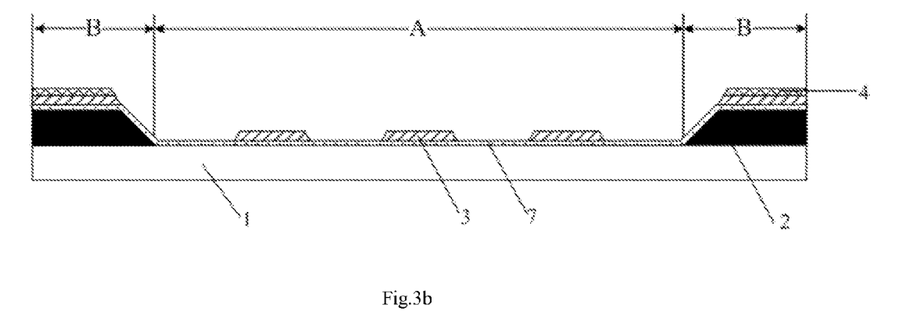
FIG. 3b is a schematic cross-sectional view showing the structure after bridging layer and peripheral traces are formed by a single patterning process according to the embodiment of the present invention.
Figure 3C:
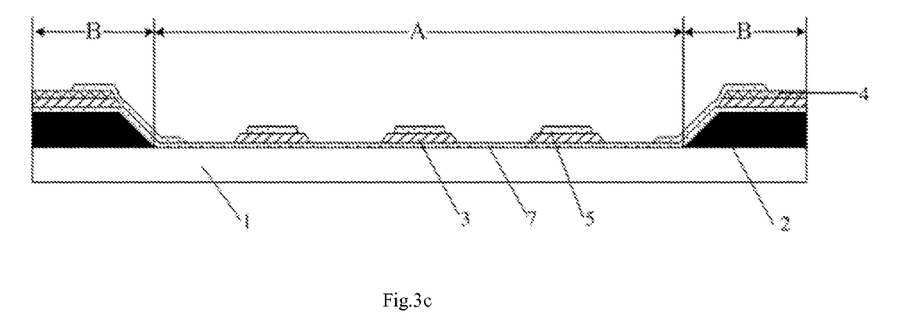
FIG. 3c is a schematic cross-sectional view showing the structure after insulating layer is formed according to the embodiment of the present invention.
Figure 3D:
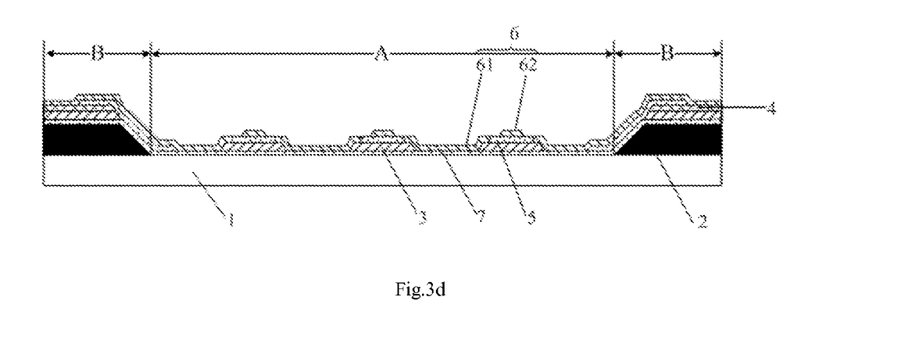
FIG. 3d is a schematic cross-sectional view showing the structure after touch control electrode layer is formed according to the embodiment of the present invention.

One embodiment of the present invention provides a manufacturing method of a single-point touch screen as shown in FIG. 2. The method specifically comprises following several steps:

In step S102, the patterns of bridging layer 3 and peripheral traces 4 are formed on the substrate 1 by a single patterning process, as shown in 3b, wherein the peripheral traces 4 have patterns only in non-touch control area B of the touch screen, and the bridging layer 3 has patterns both in the non-touch control area B and the touch control area A;

Preferably, prior to performing step S102, as shown in FIG. 2, step 101 is performed, forming patterns of shielding layer 2 on the substrate 1, as shown in FIG. 3a, wherein the shielding layer 2 only has patterns in the non-touch control area B of the touch screen, the peripheral traces 4 correspond to the area having patterns of the shielding layer 2; and the shielding layer 2 can shield the peripheral leads (i.e., the peripheral traces 4) of the touch screen;

In step S103, patterns of insulating layer 5 are formed on the peripheral traces 4, as shown in FIG. 3c, the insulating layer 5 have patterns both in the touch control area A and the non-touch control area B;

In step S104, patterns of touch control electrode layer 6 are formed on the insulating layer 5, as shown in FIG. 3d, wherein the touch control electrode layer 6 has patterns in both touch control area A and non-touch control area B; the touch control electrode layer 6 has touch control sensing electrodes 61 and touch control driving electrodes 62 arranged so that they interleaved and insulated to each other; the bridging layer 3 bridges adjacent touch control driving electrodes 62 and adjacent touch control sensing electrodes 61, which will be illustrated in FIG. 3d by taking the bridging layer 3 bridging adjacent touch control sensing electrodes 61 as an example.

Furthermore, in preparing shielding layer 2 on the substrate 1, prior to forming the bridging layer 3 and the peripheral traces 4, another layer of insulating material 7 can be deposited, as shown in FIG. 3b. This layer of insulating layer 7 do not need to be patterned using a mask plate. Of course, the deposition of the layer of insulating layer 7 is not necessarily needed, and the present invention is not limited in this aspect.

In the manufacturing method of the touch screen provided by the embodiment of the present invention, the patterning of the bridging layer and the peripheral traces can be performed simultaneously in a single patterning process. Furthermore, the patterns of the touch control electrode layer 6 formed in step 104 are located in the topmost layer of the entire touch screen and the patterns of the peripheral traces 4 formed in step S102 are located in the intermediate film layer of the touch screen. In this way, the possibility that the peripheral traces 4 contact with outside air can be avoided. Therefore, the patterning process for preparing passivation layer in the prior art can be dispensed with. Therefore, comparing to the patterning process needing six patterning processes in prior art, the present invention can reduce the number of patterning processes in the manufacture, which can enhance the production efficiency of the touch screen and thereby can reduce the production cost.

For the convenience of description in the embodiment of the present invention, the following description of the step S101-S104 uses terms such as first mask plate, second mask plate, third mask plate and forth mask plate to explain.

The following will explain the steps S101-S104 in detail respectively.

In the above step S101, forming the patterns of the shielding layer 2 on the substrate 1 can be carried out in the following way:

First, a thin film of shielding layer 2 is deposited on the substrate 1; in implementation, black photosensitive resin can be used to prepare the shielding layer 2; the black photosensitive resin can also be used as photoresist and the shielding layer can be obtained directly by exposure and development of the photoresist, which can reduce production cost;

Thereafter, the thin film of the shielding layer 2 can be patterned using the first mask plate, as shown in FIG. 3a, forming patterns of shielding layer 2.

After step S101, in step 102, the patterns of the bridging layer 3 and the peripheral traces 4 can be formed on the shielding layer 2 by a single patterning process. Furthermore, the peripheral traces can be metal traces which have relatively small resistance and good conductive effects, and which is beneficial to improve the touch control sensitivity of the touch screen.

Figure 4A:
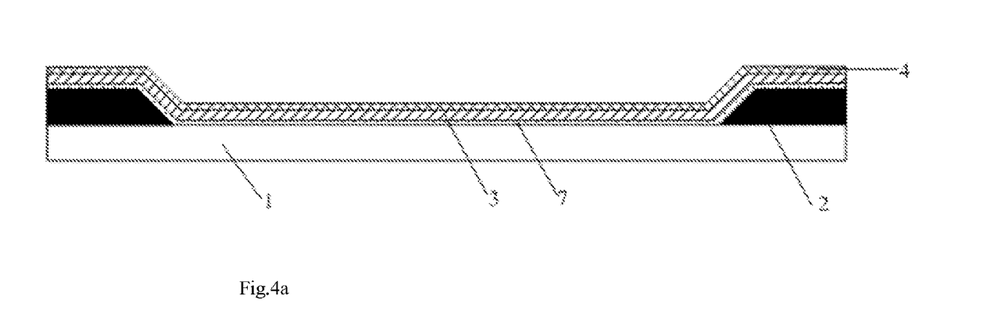
FIGS. 4a-4e are schematic cross-sectional views showing various steps in forming bridging layer and peripheral traces by a single patterning process according to the embodiment of the present invention.
Figure 4B:
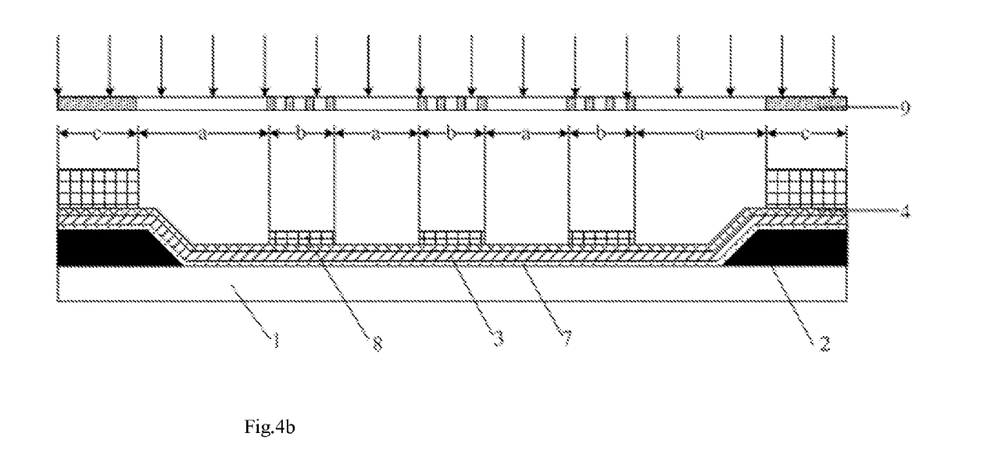

Further, the step S102 can be carried out in the following way:

First, the thin film of the bridging layer 3 and the thin film of the peripheral traces 4 can be formed sequentially on the shielding layer 2, as shown in FIG. 4a; then, photoresist 8 can be formed on the thin film of the peripheral traces 4, and the photoresist can be exposed and developed using second mask plate 9, as shown in FIG. 4b, resulting in photoresist completely removed area a, photoresist partially reserved area b and photoresist completely reserved area c, and in implementation, the second mask plate 9 is halftone mask plate and gray tone mask plate;

Wherein, the photoresist partially reserved area b corresponds to the pattern area of the bridging layer 3, and the photoresist completely reserved area c corresponds to the pattern area forming the peripheral traces 4;

Finally, the photoresist completely removed area a, the photoresist partially reserved area b and the photoresist completely reserved area c are sculptured respectively, forming patterns of bridging layer 3 and peripheral traces 4.

Figure 4C:
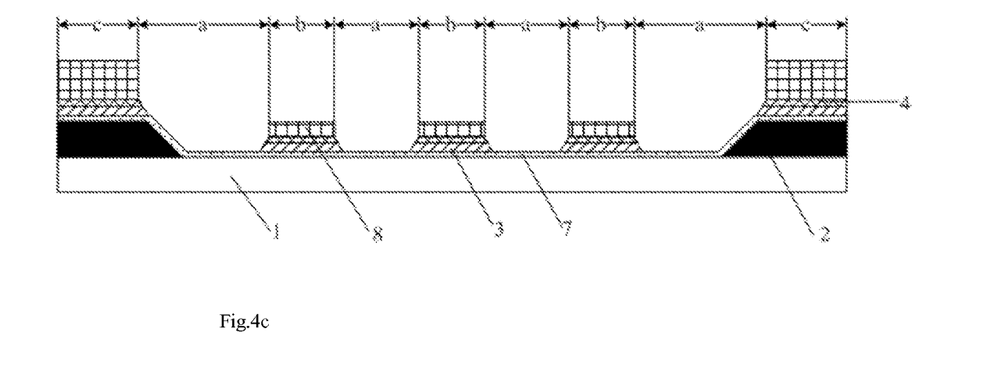

Wherein, the process of etching of the photoresist completely removed area a, the photoresist partially reserved area b and the photoresist completely reserved area c forming the patterns of the bridging layer 3 and the peripheral traces 4 is carried out by the following way:

First, removing the thin film of the bridging layer 3 and the thin film of the peripheral traces 4 in the photoresist completely removed area a using etching process, results in patterns of the bridging layer 3, as shown in FIG. 4c, wherein the bridging layer 3 will bridge adjacent touch control sensing electrodes 61 made in subsequent preparing process; it should be noted that the etching process according to the embodiment of the present invention can be wet etching or dry etching process.

Figure 4D:
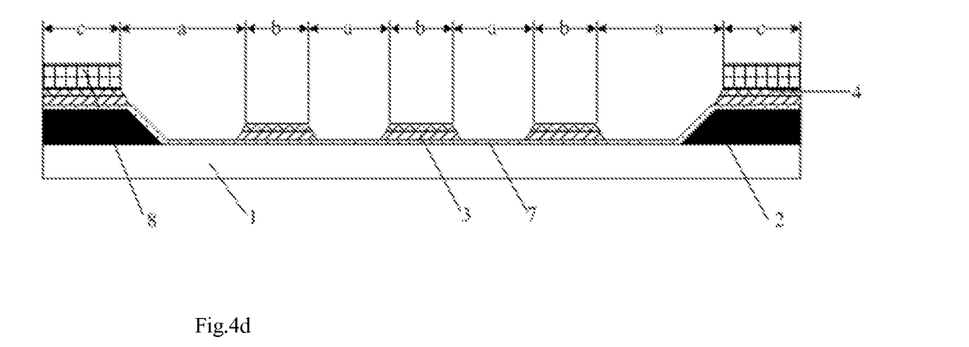
Figure 4E:
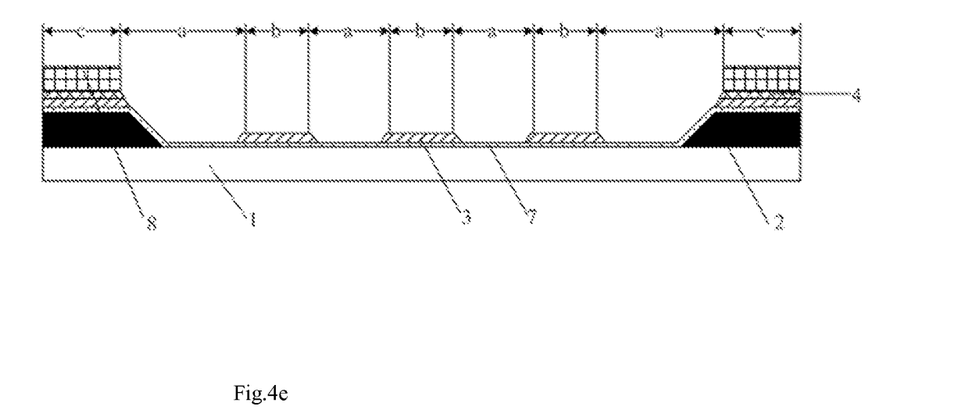

Then, by employing ashing process, the photoresist 8 in the photoresist partially reserved area b can be removed and the photoresist in the photoresist completely reserved area c can be thinned, as shown in FIG. 4d;

Next, the thin film of the peripheral traces 4 of the photoresist partially reserved area b can be removed by etching process, exposing patterns of the bridging layer 3, as shown in FIG. 4e;

Finally, the photoresist 8 of the photoresist completely reserved area c can be peeled off, resulting in patterns of the peripheral traces 4, as shown in FIG. 3b.

Preferably, in implementation, the material of the bridging layer 3 is transparent conductive material, such as indium tin oxide (ITO), indium zinc oxide (IZO) material, carbon nanotube or grapheme. The advantage of using ITO as bridging layer 3 lies in that it enhance the transmissivity of the touch screen and the light reflectivity of ITO is relatively smaller comparing to metal, which can reduce vision effects to human eyes caused by reflected light.

Of course, the bridging layer 3 can be prepared by metal material, which is not limiting herein. Moreover, when both of the bridging layer 3 and the peripheral traces 4 are made of metal material, the bridging layer 3 and the peripheral traces 4 can be provided in the same layer by a single masking process.

After finishing the step 102, in step 103, the patterns of insulating layer 5 can be formed on the peripheral traces 4, which can be realized in the following way:

First, the thin film of the insulating layer 5 can be deposited on the peripheral traces 4;

Then, the thin film of the insulating layer 5 can be patterned by using third mask plate, forming the patterns of the insulating layer 5 as shown in FIG. 3c.

After finishing step S103, in step S104, patterns of the touch control electrode layer 6 can be formed on the insulating layer 5 in the following way:

First, the thin film of the touch control electrode layer 6 is deposited on the insulating layer 5;

Then, photoresist is applied onto the thin film of the touch control electrode layer 6 and the photoresist is exposed and developed using fourth mask plate;

Finally, the thin film of the touch control electrode layer 6 is sculptured and the photoresist is peeled off, resulting in the patterns of the touch control electrode layer 6 as shown in FIG. 3d, wherein the touch control electrode layer 6 comprises touch control sensing electrodes 61 and touch control driving electrodes 62 interleaved and insulated to each other.

After finishing step 104, the patterns of the touch control electrode layer 6 can be located in the topmost layer of the entire touch screen and the peripheral traces 4 are located in the intermediate film layer of the touch screen, avoiding the possibility that the peripheral traces 4 contact with outside air. Therefore, after finishing the preparing of the touch control electrode layer 6, the preparation of the patterns of the passivation layer is unnecessary. In this way, the preparation of the touch screen can be completed by only four patterning processes comparing to six patterning processes in the prior art. Therefore, the number of patterning processes can be reduced and the production efficiency can be enhanced, thereby the production cost can be reduced.

Based on the same inventive idea, the embodiment of the present invention also provides a touch screen prepared by the above manufacturing method of touch screen. As shown in FIG. 3d, the touch screen specifically comprises: substrate 1; bridging layer 3, peripheral traces 4, insulating layer 5 and touch control electrode layer 6 staked on the substrate 1 sequentially; wherein the bridging layer 3, the insulating layer 5 and the touch control electrode layer 6 are located in the touch control area A of the touch screen; the touch control electrode layer 6 comprises touch control sensing electrodes 61 and touch control driving electrodes 62 interleaved and insulated to each other and provided on the same layer; the bridging layer 3 bridges adjacent touch control driving electrodes 62 or adjacent touch sensing electrodes 61. In FIG. 3d, take the bridging layer 3 bridging adjacent touch control sensing electrodes 61 as an example to illustrate.

The bridging layer 3, the peripheral traces 4, the insulating layer 5 and the touch control electrode layer 6 are also located in the non-touch control area B of the touch screen. As can be seen from FIG. 3d, the peripheral traces 4 are only provided in the non-touch control area B in the touch screen. Furthermore, the peripheral traces can be metal traces. Metal has smaller resistance, better conductive effects and is beneficial to improve the touch control sensitivity of the touch screen.

Specifically, as shown in FIG. 3d, the above mentioned touch screen also comprises: shielding layer 2 located in the non-touch control area B of the touch screen and between the touch control electrode layer 3 and the substrate 1.

Specifically, the material of the shielding layer 2 in the touch screen in the present embodiment can be black photosensitive resin. In this way, the black photosensitive resin can be used as photoresist in masking process, which can avoid the process of applying photoresist in separate step and reduce the usage amount of the photoresist and save production cost.

Specifically, the material of the bridging layer 3 in the touch screen can be transparent conductive material, such as indium tin oxide (ITO), indium zinc oxide (IZO) material, carbon nanotube or grapheme etc. The bridging layer can also employ metal. The advantages of employing ITO as bridging layer 3 lie in that comparing to metal, it can enhance the transmissivity of the touch screen, and the light reflectivity of the ITO is smaller, and it can reduce the vision effects to human eyes caused by reflected light. If the bridging layer 2 is made of metal, because the resistance of metal is smaller than ITO, it is advantageous to reduce the resistance of the touch control electrode layer and improve touch sensitivity. However, because metal is generally opaque to light, the transmisivity of the touch screen will be influenced. In this way, the bridging layer 3 and the peripheral traces 4 can be made by a single patterning process, i.e., the patterns of two film layers can be prepared by employing a gray tone mask plate or a halftone mask plate. Its specific preparing method is the same with the previous embodiment and will not be described in more detail. Comparing to the preparation using six patterning processes in the prior art, the number of use of the mask plate can be reduced, thereby the production efficiency of the touch screen can be improved and the production cost can be reduced.

Furthermore, in the above mentioned touch screen provided by the embodiment of the present invention, the touch electrode layer 6 is located in the topmost layer, the peripheral traces 4 is located in the intermediate film layer of the touch screen, avoiding the possibility that the peripheral traces 4 contact with outside air. Therefore, the passivation layer provided on the touch electrode layer 6 is unnecessarily, which can further simplify the structure of the touch screen.

Specifically, the material of the touch electrode layer 6 in the touch screen can be transparent conductive material, such as indium tin oxide (ITO) or indium zinc oxide (IZO) material, as well as carbon nanotube, grapheme and other transparent conductive material.

Based on the same inventive idea, the embodiment of the present invention provides a display device, which comprises the above mentioned touch screen. Such display device can be mobile phone, tablet computer, television, monitor, notebook computer, digital picture frame, navigator and any other product or component with display capabilities. Embodiments of the display device can be found in the aforementioned embodiments of touch screen, the repeated portions will not be described in more detail.

Embodiments of the present invention provide a touch screen, the manufacturing of such touch screen and a display device. Such method comprise: forming patterns of bridging layer and peripheral traces on a substrate by a single patterning process; then forming patterns of insulating layer on the peripheral traces; finally, forming patterns of touch control electrode layer on the insulating layer. In the present invention, the patterns of the bridging layer and the peripheral traces can be completed using a mask plate in a single patterning process, which can reduce the number of patterning in manufacturing process and improve the manufacture efficiency of the touch screen and reduce the production cost.

Obviously, various variations can be made to the present invention without departing from the spirit and scope of the present invention. In this way, if those modifications and variations fall in the scope of the claims of the present invention and its technical equivalents, those modifications and variations are intended to be comprised in the scope of the present invention.

What is claimed is:

1. A method for manufacturing a touch screen, comprising:
    forming patterns of a bridging layer and peripheral traces on a substrate by a single patterning process; wherein the bridging layer comprises a portion formed in a touch control area of the touch screen and a portion formed in a non-touch control area of the touch screen, and the peripheral traces are arranged on the portion of the bridging layer formed in the non-touch control area of the touch screen;
    forming a pattern of an insulating layer on the peripheral traces and on the portion of the bridging layer formed in the touch control area of the touch screen;
    forming a pattern of a touch control electrode layer on the insulating layer, wherein the touch control electrode layer comprises a portion formed in the touch control area of the touch screen and a portion formed in the non-touch control area of the touch screen, the touch control electrode layer comprises touch control sensing electrodes and touch control driving electrodes that are interleaved and insulated to each other; and the bridging layer bridges adjacent touch control driving electrodes or adjacent touch control sensing electrodes.

2. The method according to claim 1, wherein, before forming the patterns of the bridging layer and the peripheral traces on the substrate by a single patterning process, the method comprises:
    forming a pattern of a shielding layer on the substrate.

3. The method as claimed in claim 2, wherein forming patterns of the bridging layer and the peripheral traces on the shielding layer by a single patterning process comprises:
    sequentially forming a thin film of the bridging layer and a thin film of the peripheral traces on the shielding layer;
    forming photoresist on the thin film of the peripheral traces, exposing and developing the photoresist using a mask plate, resulting in a photoresist completely removed area, a photoresist partially reserved area and a photoresist completely reserved area; wherein the photoresist partially reserved area corresponds to a pattern area of the bridging layer, and the photoresist completely reserved area corresponds to a pattern area of the peripheral traces; and
    etching the photoresist completely removed area, the photoresist partially reserved area and the photoresist completely reserved area respectively to form the patterns of the bridging layer and the peripheral traces.

4. The method according to claim 2, wherein forming the pattern of the shielding layer on the substrate comprises:
    depositing a thin film of the shielding layer on the substrate; and
    patterning the thin film of the shielding layer using a mask plate, forming the pattern of the shielding layer.

5. The method according to claim 1, wherein forming patterns of the bridging layer and the peripheral traces on the substrate by a single patterning process comprises:
    sequentially forming a thin film of the bridging layer and a thin film of the peripheral traces on the substrate;
    forming photoresist on the thin film of the peripheral traces, exposing and developing the photoresist using a mask plate, resulting in a photoresist completely removed area, a photoresist partially reserved area and a photoresist completely reserved area; wherein the photoresist partially reserved area corresponds to a pattern area of the bridging layer, and the photoresist completely reserved area corresponds to a pattern area of the peripheral trace; and
    etching the photoresist completely removed area, the photoresist partially reserved area and the photoresist completely reserved area respectively to form the patterns of the bridging layer and the peripheral traces.

6. The method according to claim 5, wherein the mask plate is a halftone mask plate and a gray tone mask plate.

7. The method according to claim 5, wherein etching the photoresist completely removed area, the photoresist partially reserved area and the photoresist completely reserved area respectively to form the patterns of the bridging layer and the peripheral traces specifically comprises:
    removing the thin film of the bridging layer and the thin film of the peripheral traces in the photoresist completely removed area by an etching process, resulting in the pattern of the bridging layer;
    removing the photoresist in the photoresist partially reserved area, thinning the photoresist in the photoresist completely reserved area by an ashing process; and
    removing the thin film of the peripheral traces in the photoresist partially reserved area by an etching process, exposing the pattern of the bridging layer, peeling off the photoresist in the photoresist completely reserved area, resulting in the pattern of the peripheral traces.

8. A touch screen, comprising a substrate, a bridging layer, peripheral traces, an insulating layer and a touch control electrode layer; wherein:
    patterns of a bridging layer and peripheral traces on a substrate are formed by a single patterning process;
    the bridging layer is arranged on the substrate and comprises a portion located in a touch control area of the touch screen and a portion located in a non-touch control area of the touch screen;

the peripheral traces are arranged on the portion of the bridging layer located in the non-touch control area of the touch screen;

the insulating layer is arranged on the peripheral trances and on the portion of the bridging layer located in the touch control area of the touch screen;

the touch control electrode layer is arranged on the insulating layer and comprises a portion located in the touch control area of the touch screen and a portion located in the non-touch control area of the touch screen;

the touch control electrode layer comprises touch control sensing electrodes and touch control driving electrodes interleaved and insulated to each other and provided on a same layer;

and the bridging layer bridges adjacent touch control driving electrodes or adjacent touch control sensing electrodes.

9. The touch screen according to claim 8, further comprising a shielding layer located in the non-touch control area of the touch screen and between the touch control electrode layer and the substrate.

10. The touch screen according to claim 9, wherein a material of the shielding layer is black photosensitive resin.

11. The touch screen according to claim 8, wherein a material of the bridging layer and/or the touch control electrode layer is a transparent conductive material.

12. The touch screen according to claim 11, wherein the transparent conductive material is indium tin oxide, indium zinc oxide, carbon nanotubes, or graphene.

13. The touch screen according to claim 8, wherein the peripheral traces are only provided in the non-touch control area of the touch screen.

14. A display device, comprising the touch screen according to claim 8.

15. The display device according to claim 14, further comprising a shielding layer located in the non-touch control area of the touch screen and between the touch control electrode layer and the substrate.

16. The display device according to claim 15, wherein a material of the shielding layer is black photosensitive resin.

17. The display device according to claim 14, wherein a material of the bridging layer and/or the touch control electrode layer is a transparent conductive material.

18. The display device according to claim 17, wherein the transparent conductive material is indium tin oxide, indium zinc oxide, carbon nanotubes, or graphene.

19. The display device according to claim 14, wherein the peripheral trances are only provided in the non-touch control area of the touch screen.

* * * * *